(12) United States Patent
Akre

(10) Patent No.: US 9,685,880 B2
(45) Date of Patent: Jun. 20, 2017

(54) POWER CONVERTERS

(71) Applicant: Apple Inc., Cupertino, CA (US)

(72) Inventor: Sunil M. Akre, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/069,659

(22) Filed: Mar. 14, 2016

(65) Prior Publication Data

US 2017/0093300 A1 Mar. 30, 2017

Related U.S. Application Data

(60) Provisional application No. 62/233,587, filed on Sep. 28, 2015.

(51) Int. Cl.

| | |
|---|---|
| H01F 17/00 | (2006.01) |
| H02M 7/00 | (2006.01) |
| H05K 1/11 | (2006.01) |
| H05K 1/18 | (2006.01) |
| H05K 1/16 | (2006.01) |
| G06F 1/16 | (2006.01) |

(52) U.S. Cl.
CPC ............. *H02M 7/003* (2013.01); *G06F 1/16* (2013.01); *H05K 1/115* (2013.01); *H05K 1/165* (2013.01); *H05K 1/181* (2013.01); *H05K 2201/086* (2013.01)

(58) Field of Classification Search
CPC ....... H02M 7/003; H05K 1/115; H05K 1/181; H05K 1/165; H05K 2201/086; G06F 1/16

USPC ........................................................ 336/177
See application file for complete search history.

(56) References Cited

U.S. PATENT DOCUMENTS

| | | | | |
|---|---|---|---|---|
| 5,914,873 | A | * | 6/1999 | Blish, II .................... G06F 1/26 361/761 |
| 6,255,714 | B1 | * | 7/2001 | Kossives ............. H01F 17/0006 257/528 |
| 6,420,953 | B1 | | 7/2002 | Dadafshar |
| 6,820,321 | B2 | | 11/2004 | Harding |
| 7,417,523 | B2 | | 8/2008 | Waffenschmidt et al. |
| 8,591,262 | B2 | | 11/2013 | Schaffer et al. |
| 8,610,528 | B1 | | 12/2013 | Luzanov |
| 9,001,524 | B1 | * | 4/2015 | Akre ..................... H01F 27/027 257/670 |
| 2002/0037434 | A1 | * | 3/2002 | Feygenson .......... H01F 17/0006 428/693.1 |
| 2008/0252407 | A1 | * | 10/2008 | Anderson ........... H01F 17/0033 336/177 |
| 2012/0229986 | A1 | * | 9/2012 | Huda .................... H05K 7/209 361/720 |
| 2014/0312458 | A1 | * | 10/2014 | Ashrafzadeh ....... H01L 23/3121 257/531 |
| 2017/0011837 | A1 | * | 1/2017 | Hassan-Ali ......... H01F 27/2804 |

\* cited by examiner

*Primary Examiner* — Sherman Ng
(74) *Attorney, Agent, or Firm* — Kilpatrick Townsend and Stockton, LLP

(57) ABSTRACT

A power conversion device includes a winding portion and a core portion. The winding portion can be embedded within a plurality of layers of a system printed circuit board. The core portion can be located within one or more elements of the power conversion device that are separate from the system printed circuit board.

20 Claims, 5 Drawing Sheets

POWER CONVERTERS

CROSS-REFERENCE TO RELATED APPLICATION(S)

The present application claims the benefit of priority of U.S. Provisional Application No. 62/233,587 entitled "Power Converters," and filed on Sep. 28, 2015, the entire contents of which is hereby incorporated by reference.

FIELD

This disclosure relates to power converters. In particular, power converters that are used in connection with electronic devices.

BACKGROUND

Electrical power can be transferred to electronic devices using different current types (e.g., direct current or alternating current), which may have varying voltages. Because certain electronic devices may have particular input voltage requirements, power converters are often used to change voltage from one type to another and/or to reduce or increase voltage. However, as computers and their respective electronic devices get smaller, the footprint available for placement of electronic devices and power converters is reduced.

SUMMARY

Examples of the present disclosure are directed to power conversion devices in electronic devices. Each power conversion device can include a core portion and a winding portion. In a particular example, the winding portion can be embedded in a system printed circuit board, and the core portion can be included as part of one or more separate substrates. Including the winding portion in the system printed circuit board can enable the footprint of the power conversion device to be reduced as compared to devices that place the winding in a printed circuit board separate from the system printed circuit board or in another location.

In some examples, a power conversion device is provided that includes a conversion sub-assembly and a winding structure embedded within a plurality of conductive layers of a printed circuit board. The conversion sub-assembly is attached to the printed circuit board. The sub-assembly also includes a power integrated circuit (IC), a ferromagnetic substrate disposed below the power IC, and one or more conductive interconnects extending through the ferromagnetic substrate. The winding structure can be formed within the embedded conductive layers of the printed circuit board below the ferromagnetic substrate and be in electrical communication with the power IC via the one or more conductive interconnects.

In some examples, a motherboard is provided that includes a plurality of signaling layers arranged in a stack. The motherboard can include a power conversion area, a signal transfer area, and one or more computer components attached thereto. The power conversion area can include a power conversion device. The power conversion device can include a winding structure including a plurality of conductive winding traces embedded within the plurality of layers within the power conversion area. The power conversion device can also include a power integrated circuit (IC) disposed above the winding structure, a ferromagnetic substrate disposed between the power IC and the winding structure, and one or more conductive interconnects extending through the ferromagnetic substrate and electrically connecting the power IC and the winding structure. The signal transfer area can include a plurality of signal traces embedded within the plurality of layers within the signal transfer area. The plurality of computer components are also attached within the signal transfer area. The plurality of computer components can include a central processing unit that is in electrical communication with the power conversion device and configured to receive electrical output from the power conversion device.

In some examples, a computer is provided that includes a motherboard, a power conversion device, a computer component, and a power source. The motherboard can have a plurality of layers, a power conversion area, and a signal transfer area. The power conversion device is formed within the power conversion area and can include a winding structure. The winding structure includes a plurality of conductive layers embedded within one or more of the plurality of layers of the motherboard within the power conversion area. The power conversion device can also include a power substrate and a ferromagnetic substrate disposed between the power substrate and the winding structure. The computer component can be disposed within the signal transfer area and can be located proximate the power conversion device. The power source can be configured to provide power to the computer component. To this end, the power conversion device receives an electrical input from the power source via the power substrate and provides an electrical output to the computer component via the power substrate. The electrical input can be distinct from the electrical output at least with respect to one or more of voltage, current, or current type.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

The disclosure will be readily understood by the following detailed description in conjunction with the accompanying drawings, in which.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Figure 1:
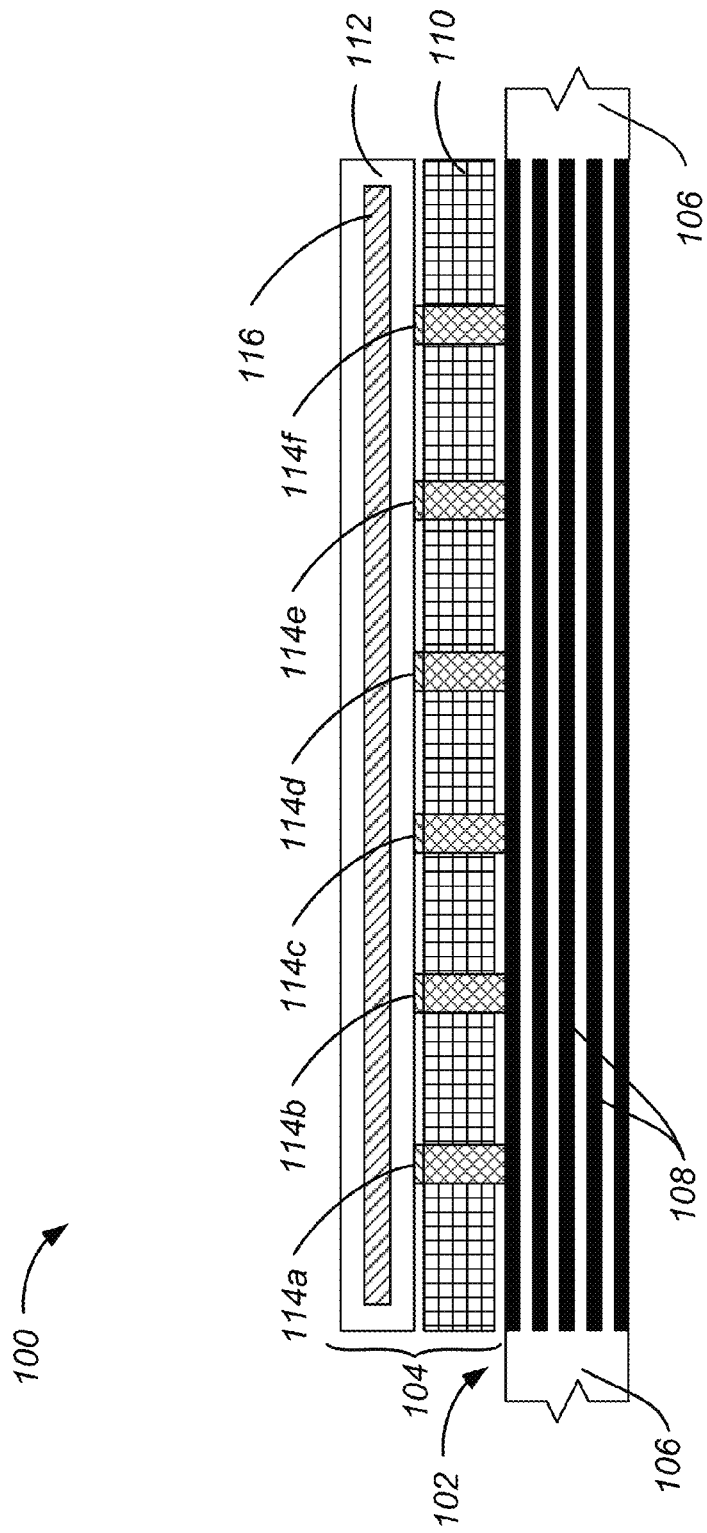
FIG. 1 shows a power conversion device including a sub-assembly, in accordance with at least one example.

FIG. 1 is a simplified cross-sectional view that illustrates a power conversion device 100 in accordance with at least one example. The power conversion device 100 can be configured to convert current from a first current type (e.g., alternating current (AC)) to a second current type (e.g., direct current (DC)) or to convert DC current from a first DC current level to a second DC current level. The power conversion device 100 can have a magnetic component configured as an inductor. In some examples, the power conversion device 100 (and other power conversion devices described herein) can contain inductors and transformers.

In order to convert current as described herein, the power conversion device 100 includes a winding structure 102 and a sub-assembly 104. The winding structure 102 can be formed within a primary substrate 106. In some examples, the primary substrate 106 can be a multi-layer printed circuit board (PCB) or other suitable device configured to retain computer components and provide signaling traces. The signaling traces can run between the computer components within various signal layers 108 embedded within the primary substrate and formed on the top and/or bottom of the substrate. To this end, the primary substrate 106 can be a system motherboard (e.g., a main logic board) that routes signals between a processor and various memory and other integrated circuitry attached to the motherboard. When the primary substrate 106 is implemented as a multi-layer PCB, the PCB can be manufactured using any suitable manufacturing process that forms multiple metal signal layers 108 within the PCB. In various examples, the multi-layered PCB can include more than 5, more than 10, more than 20 or more than 25 metal signal layers 108 embedded within the PCB.

The winding structure 102 is formed within the embedded signal layers 108 within the primary substrate 106 and can include a plurality of conductive power traces disposed among the plurality of horizontal layers of the primary substrate 106. The plurality of conductive power traces extend laterally and width-wise within the primary substrate 106 to correspond to the length and width dimensions of the sub-assembly 104. The winding structure 102 can also extend between various layers of the plurality of horizontal layers with power traces in one signal layer connected to power traces in another signal layer by one or more vias formed within the primary substrate 106 between different signal layers 108 to form a desired winding shape. In other words, the winding structure 102 can extend both vertically (e.g., by one or more vias) and horizontally within the primary substrate 106 underneath the footprint of the sub-assembly 104.

The winding structure 102 typically carries significantly more current than standard signal traces. To accommodate the high current levels, the width of each of the plurality of conductive power traces is typically greater than the width of the signaling traces described herein and located in other portions of the primary substrate 106. For example, the width of each of the plurality of conductive power traces can be at least 100 times greater than the width of standard signal traces formed in the primary substrate 106 and, in some embodiments the width can be 400-500 times wider than the signaling traces.

In some examples, the entirety of the winding structure 102 is embedded within the primary substrate 106. Thus, instead of the winding structure 102—or even a portion of the winding structure 102—being formed within the sub-assembly 104, the winding structure 102 can be contained within the primary substrate 106. Also, in some examples, the winding structure 102 includes a single winding formed underneath the footprint of the sub-assembly 104 having a single input and a single output. In other examples, the winding structure 102 includes multiple separate windings, each with its respective input and output.

The signal layers 108 can be formed from copper or some other conductive material typically used in power conversion devices. The conductive power traces within the signal layers 108 can be patterned in various layers and interconnected between various layers in accordance with a desired winding pattern. The pattern can be designed in a manner to optimize the space in the primary substrate 106 and/or to maximize the function of the power conversion device 100. In some examples, the winding pattern includes a three-dimensional pattern in which the plurality of conductive power traces is patterned in series or parallel. In some examples, a first portion of the plurality of conductive power traces is patterned in series, while a second portion of the plurality of conductive power traces is patterned in parallel. In some examples, the winding structure 102 can include 20-30 layers in which the plurality of conductive power traces is located.

Turning now to the sub-assembly 104, the sub-assembly 104 can include a ferromagnetic substrate 110 and a power IC or a power substrate 112. The ferromagnetic substrate 110 is disposed between the power substrate 112 and the winding structure 102, with a bottom surface of the ferromagnetic substrate 110 adjacent to a top surface of the primary substrate 106. In some examples, the bottom surface of the ferromagnetic substrate 110 is in physical contact with the top surface of the primary substrate 106. The ferromagnetic substrate 110 is disposed directly above the winding structure 102 and can be attached to the primary substrate 106. In some examples, the sub-assembly 104 is disposed below the primary substrate 106.

The ferromagnetic substrate 110 can be formed from any suitable ferromagnetic material. In this manner, the ferromagnetic substrate 110 functions as a "magnetic core" for the power conversion device 100, i.e., a core portion of the power conversion device 100. Because the winding structure 102 is formed from a conductive material, the winding structure 102 can function as "windings" for the power conversion device 100, i.e., a winding portion of the power conversion device 100.

In some examples, the power substrate 112 can be a PCB and can include any suitable number of passive and/or active components (e.g., integrated circuits, metal-oxide-semiconductor field-effect transistors, resistors, capacitors, etc.) attached thereto or embedded therein. In the example shown in FIG. 1, the power substrate 112 can include a power integrated circuit (IC) 116. In other examples, the power substrate 112 can be an integrated circuit that is mounted to the ferromagnetic substrate 110. In some examples, any of the passive or active components (e.g., the integrated circuit 116) can be in electrical communication with the winding structure 102 via one or more conductive interconnects 114. The number of conductive interconnects 114 can vary depending on the embodiment. In some examples, the one or more conductive interconnects 114 are pins or electro-plated holes. In this manner, the one or more conductive interconnects 114 can function as electrical connections from the power substrate 112 and the primary substrate 106. Using these connections, at least some of the components within the power substrate 112 can communicate with other components attached to the primary substrate 106, receive power from a power source, and provide power to other components. When the power conversion device 100 functions as 1-phase DC-DC converter, it can have one input and one output, which can correspond to the one or more conductive interconnects 114. In some examples, the power conversion device 100 is configured to function multi-phase or multi-output DC-DC converter. In this example, the power conversion device 100 can include more than one input and one output.

Figure 2:
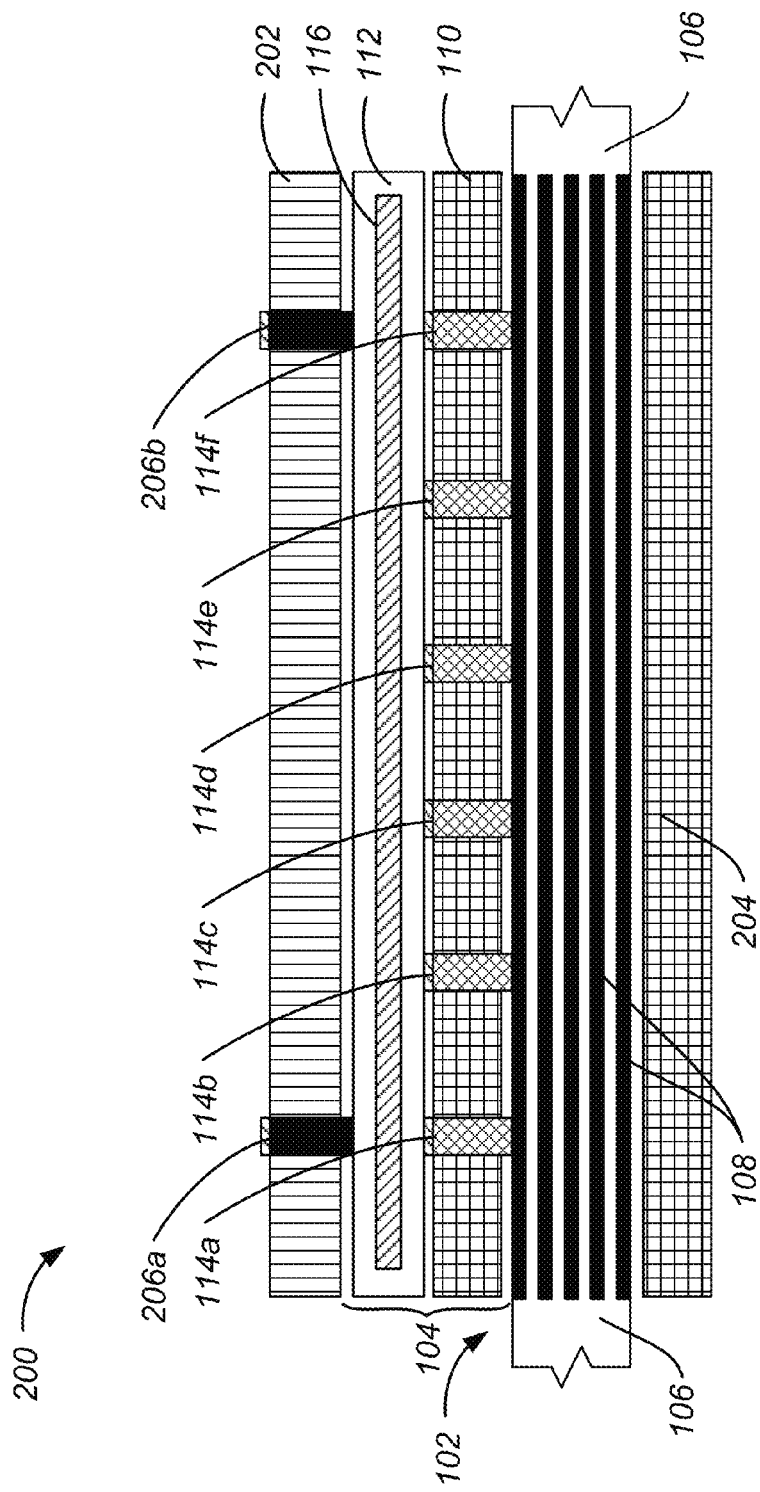
FIG. 2 shows a power conversion device including a sub-assembly and an additional ferromagnetic substrate, in accordance with at least one example.

FIG. 2 illustrates a power conversion device 200 in accordance with at least one example of the disclosure. In addition to features discussed with reference to the power conversion device 100, the power conversion device 200 can include a decoupling tile 202 and a ferromagnetic tile 204. The decoupling tile 202 can be disposed above the power substrate 112 and can be attached to the power substrate 112. The decoupling tile 202 can include one or more capacitors, arranged in a capacitor bank, in close proximity to the power substrate 112 and to the other components of the power conversion device 200.

In some examples, the decoupling tile 202 includes one or more connection points 206. The connection points 206 can function as terminals for the power conversion device 200. The power conversion device 200 can cause a change in one or more characteristics of the input current, which can result in an output current that is distinct from the input current with respect to at least one of the one or more characteristics. For example, the power conversion device 200 can convert input AC to output DC.

The ferromagnetic tile 204 is disposed below the winding structure 102 and can be attached to the primary substrate 106. The ferromagnetic tile 204 can be formed from the same material as the ferromagnetic substrate 110 or from a different material that also has magnetic properties. In this manner, the ferromagnetic tile 204 can function to close a magnetic circuit within the power conversion device 200. In some examples, the magnetic circuit extends from the ferromagnetic substrate 110 to the ferromagnetic tile 204 and includes the winding structure 102. In some examples, the addition of the ferromagnetic tile 204 improves inductance of the magnetic component portion of power conversion device 200. In some examples, the inclusion of the ferromagnetic tile 204 enables the power conversion device 200 to perform power transformation functions.

Figure 3:
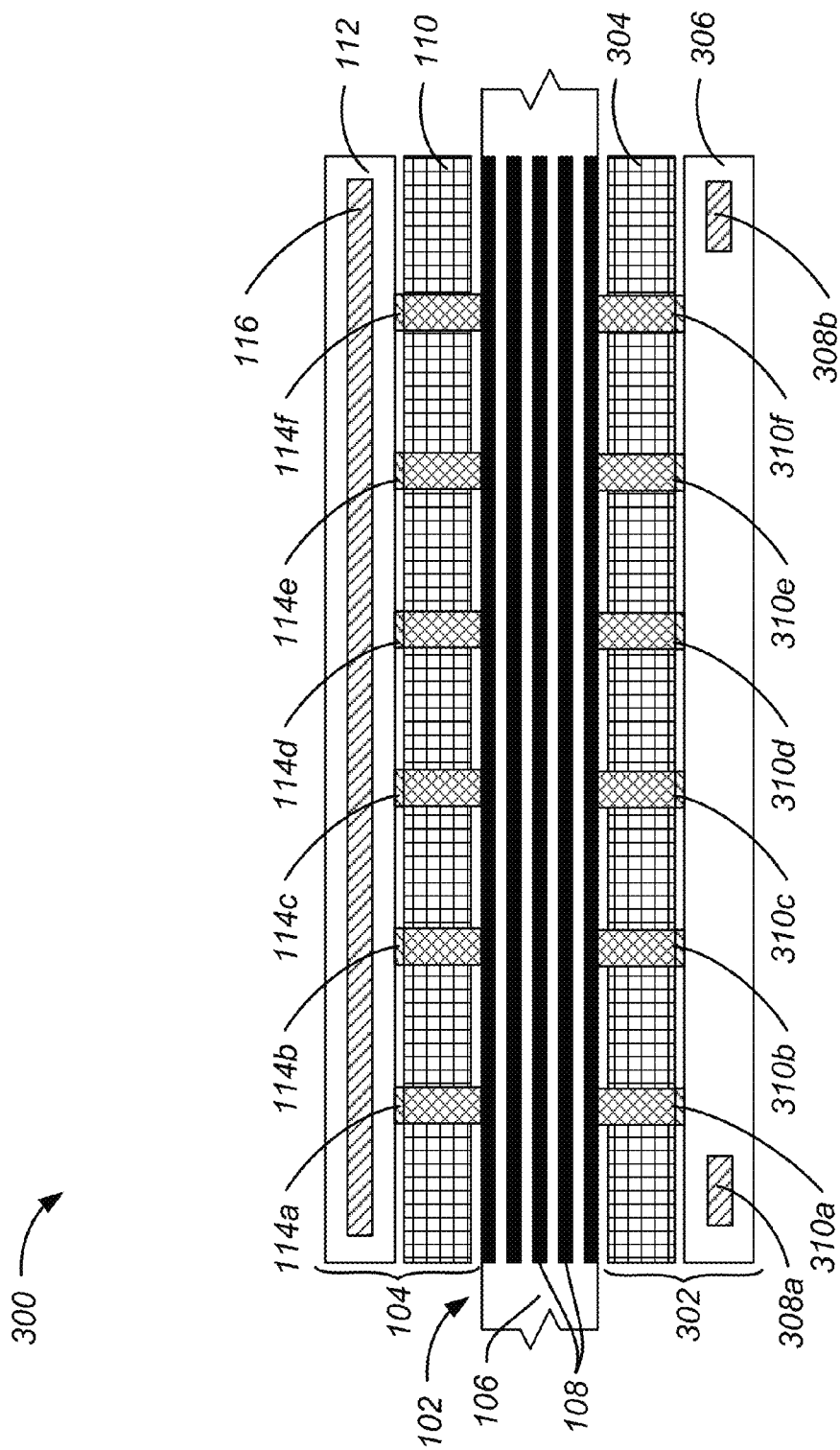
FIG. 3 shows a power conversion device including two sub-assemblies, in accordance with at least one example.

FIG. 3 illustrates an example power conversion device 300 in accordance with another example of the disclosure. In addition to features discussed with reference to the power conversion device 100, the power conversion device 300 includes a second sub-assembly 302. In some examples, the second sub-assembly 302 is similar in design and construction to the sub-assembly 104. To this end, the second sub-assembly 302 can include a second ferromagnetic substrate 304 and a second power substrate 306.

The second ferromagnetic substrate 304 can be disposed between the second power substrate 306 and the winding structure 102, with a top surface of the second ferromagnetic substrate 304 adjacent a bottom surface of the primary substrate 106. In some examples, the top surface of the second ferromagnetic substrate 304 is in physical contact with the bottom surface of the primary substrate 106 and can be attached to the primary substrate 106. In some examples, the second ferromagnetic substrate 304 is disposed directly below the footprint of the winding structure 102. The second ferromagnetic substrate 304 can be manufactured from any suitable ferromagnetic material. In this manner, the second ferromagnetic substrate 304 can function as part of a magnetic core for the power conversion device 300.

Like the power substrate 112, the second power substrate 306 can include any suitable number of passive or active components embedded therein. In this example, the second power substrate 306 can include one or more power switches 308. In some examples, any of the passive or active components (e.g., the one or more power switches 308) can be in electrical communication with the winding structure 102 via one or more second conductive interconnects 310. The number of second conductive interconnects 310 can vary depending on the embodiment. In some examples, the one or more second conductive interconnects 310 are pins or electro-plated holes. The one or more second conductive interconnects 310 can function as electrical connections from the second power substrate 306 to the primary substrate 106. In this manner, at least some of the components within the second power substrate 306 can communicate with other components attached to the primary substrate 106, receive power from a power source, and provide power to other components.

In some examples, the power conversion device 300, including the sub-assembly 104 and the second sub-assembly 302, functions as a transformer, a multiphase converter, or any other suitable power conversion device. In some examples, the sub-assembly 104 is considered a primary section of the power conversion device 300 and the second sub-assembly 302 is considered a secondary section of the power conversion device 300. In this example, the sub-assembly 104, in connection with the winding structure 102 (i.e., the primary section), performs inversion on an electrical input. For example, incoming 400V DC can be inverted to high-frequency AC. Also in this example, the second sub-assembly 302, in connection with the winding structure 102 (i.e., the second section), rectifies the high-frequency AC that was previously inverted. For example, the high-frequency AC can be rectified to result in 1V DC. In this example, the power substrate 112 and the second power substrate 306 can include the appropriate components in order to perform the inversion and rectification described herein.

Figure 4:
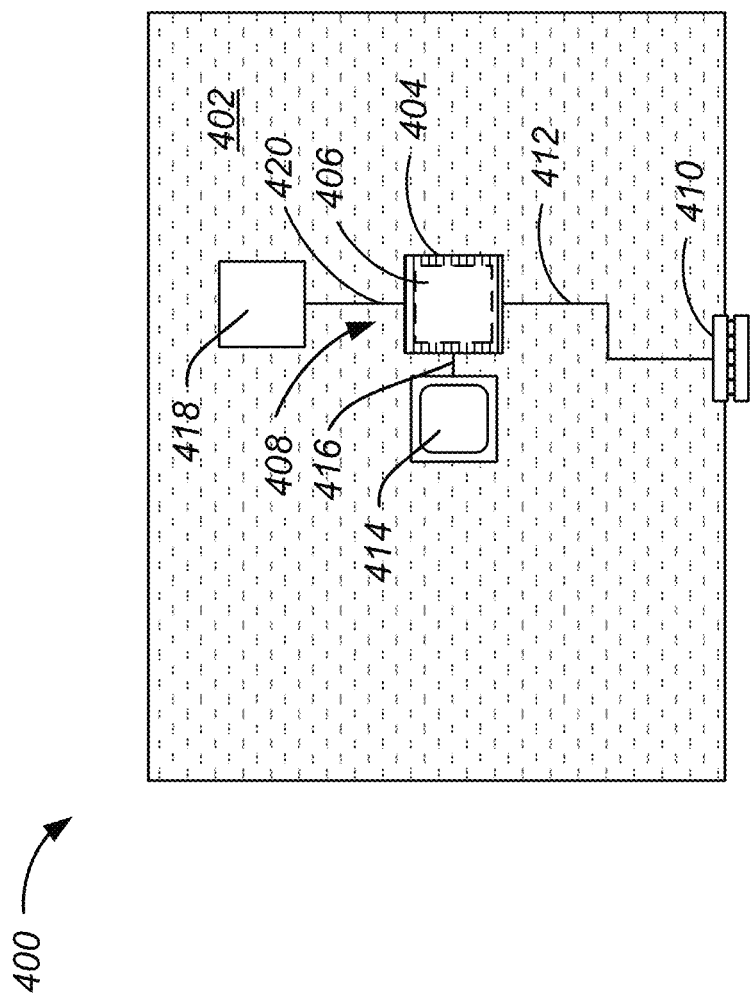
FIG. 4 shows an example motherboard including a power conversion area, a microprocessor, and a signal transfer area, in accordance with at least one example.

FIG. 4 illustrates a motherboard 400 in accordance with at least one example of the disclosure. The motherboard 400 is an example of the primary substrate 106 described herein and can therefore include a plurality of signal layers embedded within the motherboard 400 as well as a signal layer on the top and/or bottom exterior surfaces of the motherboard 400. The motherboard 400 can function to provide structural support for one or more components of the motherboard 400. The motherboard 400 also provides for routing of control signals and power. To this end, the motherboard 400 can include a signal transfer area 402 and a power conversion area 404.

The signal transfer area 402 is an area of the motherboard 400 that includes a plurality of signal routing traces disposed therein. The signal routing traces can extend between various components (e.g., a microprocessor 414, one or more memory chips (not shown), a graphics processor (also not shown), or the like) of the motherboard 400. The signal routing traces can be formed from electrically conductive material within the plurality of layers of the motherboard 400. In some examples, the signal routing traces carry control signals and other data signals between the components of the motherboard 400.

The power conversion area 404 can be an area of the motherboard 400 that includes the winding structure 102 and its associated conductive power traces as described above.

As discussed above, signal traces within power conversion area 404 that carry power are typically significantly wider than signal traces that carry data and other signals in area 402. For example, in some embodiments, the width of traces in power conversion area 404 that carry power are at least 100 times greater than the width of standard signal traces formed in area 402 and, in some instances the width of the traces in power conversion area 404 can be 400-500 times greater than the width of the signal traces in area 402. The power conversion area 404 generally does not include conventional signal routing traces to avoid potential issues associated with noise from the conductive power traces. Thus, the power conversion area 404 is distinguishable from the signal transfer area 402 based on the function and design of the traces formed therein. As described with reference to FIG. 5, motherboards can include more than one power conversion area 404.

The motherboard 400 includes a sub-assembly 406 disposed within the power conversion area 404. The sub-assembly 406 is in electrical communication with the power conductive traces in the power conversion area 404 to form a power conversion device 408. The sub-assembly 406 is an example of the sub-assembly 104. The power conversion device 408 is an example of the power conversion devices 100, 200, and 300. The power conversion device 408 can receive power via a plug connector 410 and an input line 412. The plug connector 410 can be used to connect the motherboard 400 to other components of a computing device, in which the motherboard 400 is included, or to external devices. For example, the plug connector 410 can attach the motherboard to a power source (e.g., a battery).

The motherboard 400 can also include the microprocessor 414. The microprocessor 414 is an example of a central processing unit or other processor that requires power to function. The microprocessor 414 receives power from the power conversion device 408 via an output 416 from the power conversion device 408. In order to maximize space and minimize voltage drops, the microprocessor 414 can be located adjacent the power conversion device 408. In some examples, the power conversion device 408 is designed to provide one or more power levels that are suitable for the microprocessor 414. In this manner, the power conversion device 408 can be a customized power conversion device. In some examples, other computer components (e.g., a computer component 418) may be attached to the motherboard 400 within the signal transfer area 402. The computer component 418 can receive power from the power conversion device 408 via an output 420 from the power conversion device 408.

Figure 5:
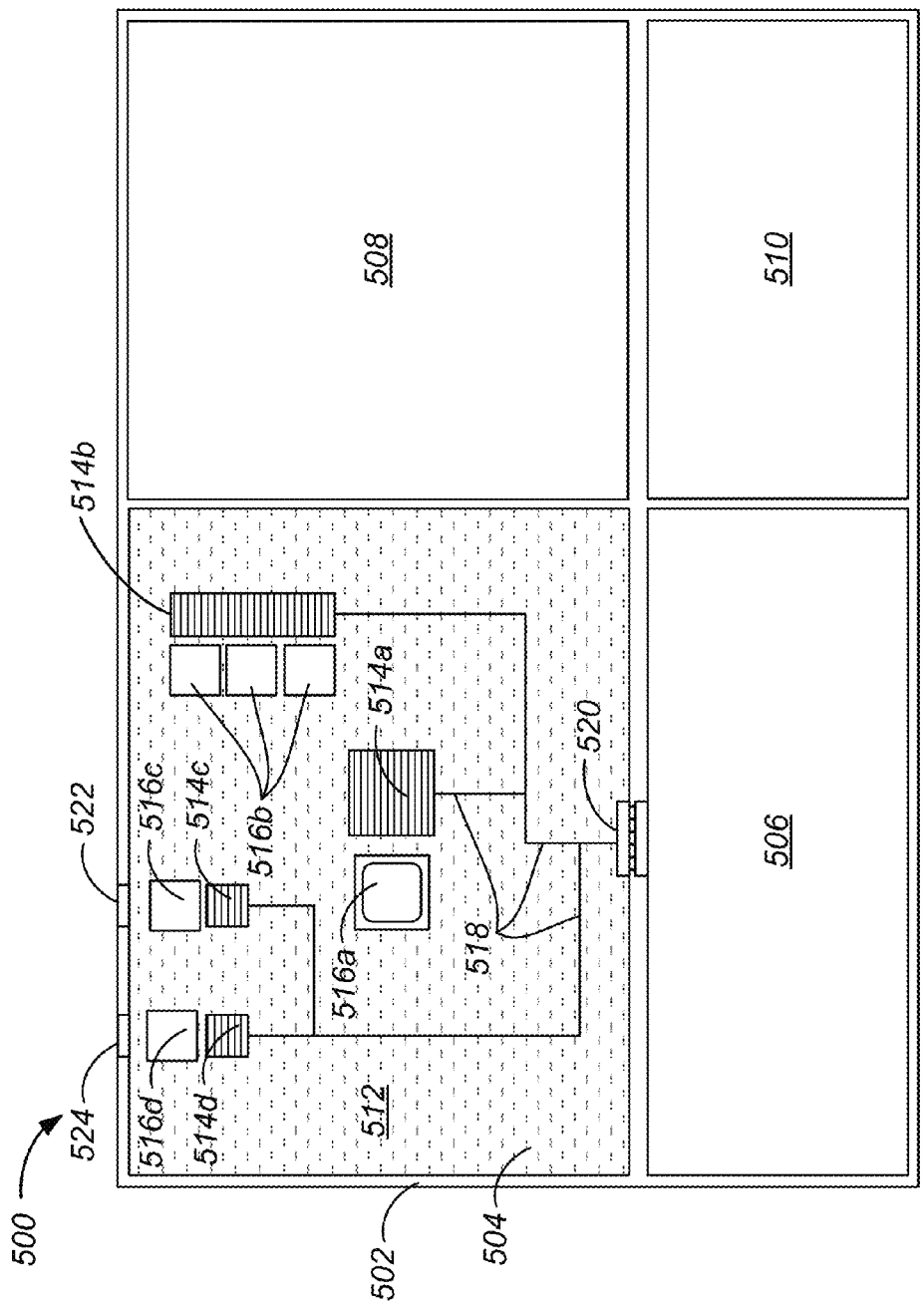
FIG. 5 shows an example computing device including a motherboard, power conversion devices, and computer components, in accordance with at least one example.

FIG. 5 illustrates a computer 500 in accordance with at least one example of the disclosure. The computer 500 is any suitable computing device, which can be a user device (e.g., a laptop computer, a wearable device, a tablet, a thin-client device, a mobile phone, a media device, and any other suitable user device), a large server (e.g., rack-mountable server), a server cluster, or any other suitable computing device. To this end, the computer 500 can include a body 502 formed from a rigid material and configured to retain other components of the computer 500. Within the body 502 can be attached a motherboard 504, a battery 506, and a hard drive 508. Other computer components can be attached to the body 502 within area 510 (the "other area 510").

The motherboard 504 is an example of the motherboard 400. To this end the motherboard 504 includes a signal transfer area 512 and a plurality of power conversion areas including a plurality of power conversion devices 514. The plurality of power conversion devices 514 receive power from the battery 506 via one or more traces 518. The one or more traces 518 are in electrical communication with the battery 506 via a connector 520. The one or more traces 518 are examples of the traces 412 and 416. The connector 520 is an example of the plug connector 410.

Each of the power conversion devices 514 in each of the power conversion areas can be designed and manufactured to correspond to a respective computer component 516 that receives power from the power conversion device 514. Thus, the sizes of the power conversion devices 514 and the functions of the power conversion devices 514 can vary one from another. For example, the power conversion device 514a can be suited to provide power to a central processing unit 516a. The power conversion device 514b can be suited to provide power to a bank of memory units 516b. The power conversion device 514b is an example of a power conversion device that can be configured to provide power to more than one component. In some examples, each component of the motherboard 504 that requires power is associated with its own power conversion devices.

The power conversion device 514c can be suited to provide power to a uniform serial bus (USB) chip 516c, which is in communication with a USB port 522. The power conversion device 514d can be suited to provide power to a network chip 516d, which is in communication with a network port 524. Other examples of computer components that can be associated with power conversion devices include: audio drivers, display drivers, Wi-Fi chips, input/output device controllers, local area network chips, basic input/output system chips, graphics chips, random-access memory, read-only memory, drive connectors, modem chips, and any other suitable component that can be included in a computer.

The battery 506 can be any suitable power source and provides DC current and/or AC current. In some examples, the battery 506 is bypassed when the computer 500 is plugged into an electrical outlet (e.g., a wall outlet) that provides AC current. In this example, a power conversion device can be configured to convert the AC current to DC current usable by the computer components. In some examples, the AC current is delivered to each power conversion device and each power conversion device converts the AC current to DC as needed. In some examples, the AC current charges the battery 506, which then can be used to provide DC current to the computer components.

The hard drive 508 can be any suitable hard drive, which can be solid-state or mechanical. In some examples, the hard drive 508 is in electrical communication, both for signaling and power, with the other components of the computer 500. For example, the hard drive 508 can receive power from the battery 506 and control signals from the motherboard 504.

The other area 510 can include other components of the computer 500. For example, the other area can include auxiliary fans, disk drives, cards not included on the motherboard 504, and any other suitable component. These components can also be in electrical communication with other components of the computer 500.

Spatially relative terms, such as "below", "above", "lower", "upper" and the like may be used above to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claim.

What is claimed is:

1. A power conversion device, comprising:
    a printed circuit board comprising a plurality of embedded conductive layers formed within the printed circuit board;
    a power conversion sub-assembly attached to the printed circuit board, the power conversion sub-assembly comprising:
        a power integrated circuit (IC);
        a ferromagnetic substrate disposed between the power IC and the printed circuit board; and
        a conductive interconnect extending through the ferromagnetic substrate; and
    a winding structure formed within the embedded conductive layers of the printed circuit board below the ferromagnetic substrate and in electrical communication with the power IC via the conductive interconnect.

2. The power conversion device of claim 1, further comprising a ferromagnetic tile, the winding structure disposed between the ferromagnetic substrate and the ferromagnetic tile.

3. The power conversion device of claim 1, wherein the power conversion sub-assembly is a first power conversion sub-assembly, the power IC is a first power IC, the ferromagnetic substrate is a first ferromagnetic substrate, and the conductive interconnect is a first conductive interconnect, the power conversion device further comprising a second power conversion sub-assembly disposed below the primary circuit board, the second power conversion sub-assembly comprising:
    a second power IC;
    a second ferromagnetic substrate disposed between the printed circuit board and the second power substrate; and
    a second conductive interconnect extending through the second ferromagnetic substrate and being in electrical communication with the winding structure.

4. The power conversion device of claim 3, wherein the second power IC comprises one or more power switches in electrical communication with the winding structure.

5. The power conversion device of claim 1, wherein the printed circuit board comprises at least one power portion and at least one signal portion, the winding structure disposed within the at least one power portion.

6. The power conversion device of claim 1, further comprising a decoupling tile disposed above the power conversion sub-assembly, the decoupling tile comprising one or more capacitors.

7. The power conversion device of claim 6, wherein the decoupling tile comprises an input terminal in electrical communication with the power IC and an output terminal in electrical communication with the power IC.

8. The power conversion device of claim 7, wherein the power conversion device is configured to convert an input current received via the input terminal and output an output current via the output terminal.

9. The power conversion device of claim 1, wherein the winding structure comprises a first portion that is patterned in series and a second portion that is patterned in parallel.

10. A motherboard having a plurality of layers arranged in a stack, the motherboard comprising:
    a power conversion area comprising a power conversion device, the power conversion device comprising:
        a winding structure comprising a plurality of conductive power traces embedded within the plurality of layers within the power conversion area;
        a power substrate attached to the motherboard;
        a ferromagnetic substrate disposed between the power substrate and the winding structure; and
        a conductive interconnect extending through the ferromagnetic substrate and electrically connecting the power substrate and the winding structure; and
    a signal transfer area comprising:
        a plurality of signal traces embedded within the plurality of layers; and
        a computer component in electrical communication with the power conversion device.

11. The motherboard of claim 10, further comprising:
    a plug connector configured to attach to a power source; and
    a power trace extending between the plug connector and the power conversion device in at least one layer of the plurality of layers.

12. The motherboard of claim 11, wherein the power conversion device is configured to receive a first current from the power source via the power trace and provide a second current to the computer component.

13. The motherboard of claim 10, wherein the power substrate comprises an integrated circuit, the conductive interconnect electrically connecting the integrated circuit and the winding structure.

14. The motherboard of claim 10, wherein the computer component comprises a microprocessor.

15. The motherboard of claim 10, wherein the power substrate, the ferromagnetic substrate, and the conductive interconnect are disposed above the winding structure.

16. The motherboard of claim 15, wherein the power substrate is a first power substrate, the ferromagnetic substrate is a first ferromagnetic substrate, and the conductive interconnect is a first conductive interconnect, the power conversion device further comprising:
    a second power substrate attached to the motherboard;
    a second ferromagnetic substrate disposed between second power substrate and the winding structure; and
    a second conductive interconnect extending through the second ferromagnetic substrate and electrically connecting the second power substrate and the winding structure.

17. A computer, comprising:
    a motherboard having a plurality layers, the motherboard comprising:
        a power conversion area; and
        a signal transfer area;
    a power conversion device, at least a portion of which being disposed within the power conversion area, the power conversion device comprising:

a winding structure comprising a plurality of conductive power traces embedded within one or more of the plurality of layers within the power conversion area;

a power substrate; and a ferromagnetic substrate disposed between the power substrate and the winding structure;

a computer component disposed within the signal transfer area and proximate the power conversion device; and a power source configured to provide power to the computer component, wherein the power conversion device receives an electrical input from the power source via the power substrate and provides an electrical output to the computer component via the power substrate.

18. The computer of claim 17, wherein the computer component is a first computer component and the electrical output is a first electrical output, the computer further comprising a second computer component disposed within the signal transfer area, the power conversion device configured to provide a second electrical output to the second computer component via the power substrate.

19. The computer of claim 17, wherein the power conversion device is a first power conversion device, the power conversion area is a first power conversion area, the computer component is a first computer component, the electrical input is a first electrical input, and the electrical output is a first electrical output, the computer further comprising a second power conversion device, at least a portion of which being disposed within a second power conversion area, the second power conversion device configured to receive a second electrical input from the power source and provide a second electrical output to the second computer component.

20. The computer of claim 17, wherein the electrical input is AC current and the electrical output is DC current.

* * * * *